Feb. 13, 1968 U. MESTER 3,369,183

BINARY FREQUENCY DIVIDER CIRCUIT HAVING EXTERNALLY ADJUSTABLE FREQUENCY SELECTION MEANS AND RESET MEANS

Filed July 12, 1965 4 Sheets-Sheet 1

Inventor:
Ulrich Mester

By: Spencer & Kaye
Attorneys

Inventor:
Ulrich Mester
By: Spencer & Kaye
Attorneys

Feb. 13, 1968 U. MESTER 3,369,183

BINARY FREQUENCY DIVIDER CIRCUIT HAVING EXTERNALLY ADJUSTABLE FREQUENCY SELECTION MEANS AND RESET MEANS

Filed July 12, 1965 4 Sheets-Sheet 3

Inventor:
Ulrich Mester
By: Spencer & Kaye
Attorneys

Inventor:
Ulrich Mester
By: Spencer & Kaye

United States Patent Office 3,369,183
Patented Feb. 13, 1968

3,369,183
BINARY FREQUENCY DIVIDER CIRCUIT HAVING EXTERNALLY ADJUSTABLE FREQUENCY SELECTION MEANS AND RESET MEANS

Ulrich Mester, Burlafingen, Germany, assignor to Telefunken Patentverwertungsgesellschaft m.b.H., Ulm (Danube), Germany Filed July 12, 1965, Ser. No. 471,231
Claims priority, application Germany, July 11, 1964, T 26,567
7 Claims. (Cl. 328—48)

ABSTRACT OF THE DISCLOSURE

A binary frequency divider including a plurality of series-connected frequency counting stages, each of the counting stages being assigned to one decade of an adjustable division factor, wherein the counting stages always count from a number *n*, which can be externally set, up to a final position or number K—2 which is the same for all division factors, where K is the largest number that can be registered in the counter. Switching means is provided for blocking the input of the counting stage when the counter reaches its final position, and gate means is provided for resetting the counter to its starting position *n* on the subsequent input pulse.

The present invention relates generally to digital frequency dividers, and, more particularly, to such a divider having an adjustable division factor and including series-connected frequency divider stages each assigned to an individual decade of the division factor, and wherein the counting stages always count from a number *n*, which can be externally set, up to a final position or number which is the same for all division factors, at which point the counting stages are again reset to a corresponding position to the number *n* and a signal appears at the output of the divider.

In many frequency processing systems which can be set in decade manner successive frequencies covering a large frequency band of, for example, 10 megacycles are required. However, neighboring frequencies have to have a frequency spacing of, for example 10 kilocycles. For this reason digital frequency dividers having an adjustable division factor can be utilized. Such frequency dividers comprise a number of series-connected counting stages. Each counting stage includes four flip-flops assigned to one decade of the division factor.

A counting stage having four flip-flops can actually count up to the number 16. In order to use such a counting stage in a decade manner, the counting stage must be modified. According to one proposal an AND-gate is connected between the first and the second flip-flop and this gate is simultaneously controlled by the last flip-flop.

Other solutions for this problem are also known. However, since these counting stages per se are not a part of the invention but are assumed to be known, the known arrangement will not be discussed in further detail.

However, it is to be noted that it is possible to modify all of the counting stages except for the last one. In such an arrangement a system including free series-connected counting stages can count up to 1599 instead of up to 999. The reason for this is that the last counting stage in addition to the zero position has 15 possible other positions or conditions. Thus, with such a construction of the last counting stage it is possible to carry out a division up to the division factor 1599.

In accordance with the state of the art, the divider can be constructed so that the counting of the frequency to be divided is always begun with the starting position of the counter and progresses up to a settable number which is the division factor. After reaching the set number, the devices automatically switch back to the starting position and at the same time a pulse is delivered to the output of the divider. In such an arrangement the division factor is equal to the number which is set at the divider. Also, the momentary positions of the flip-flops of the counting stage are compared with set numbers in comparison stages and, when the positions of the counter are the same as those of the set number, a pulse is produced. This pulse, on the one hand, provides resetting of the counting stages into the starting position, and on the other hand, represents the output signal of the divider.

Such an arrangement is disclosed for example in my copending application Serial Number 456,205 filed May 17, 1965 and entitled Converter. However, there is a limitation in using such an arrangement since when using flip-flops which can follow a frequency of 20 megacycles, the maximum divider frequency is 3.6 megacycles. This relatively low divider frequency is determined by the fact that within the period corresponding to the duration of the period or the cycle of the input frequency, coincidence must be indicated by the comparison stages if coincidence does exist. Furthermore, a resetting to the zero position must be effected.

It is also possible to begin counting at a preset number and to terminate the counting operation with a number which is the same for all division factors. When three divider stages are used this number for example would be 1000. In this case, the division factor N is determined by the difference between the number corresponding to the final position and the set number *n*, (N=1000—*n*). In this type of arrangement the output pulse from the lines of the series-connected counting stages which appears when the counter has obtained its final position (in the case of three counting stages this would be the number 1000) resets the entire counting arrangement to the set number. At the same time the frequency of the output pulses equals $f_E/N$, where $f_E$ is the input frequency of the divider and N is the division factor.

With this type of arrangement the maximum divider frequency is also 3.6 megacycles if flop-flops are used which can follow the frequency of 20 megacycles. Also, this arrangement has the disadvantage that the setting of the division factor creates problems because the setting of the ones, tens, and hundreds digits are not always independent from one another. In such an arrangement the individual digits of the division factor would be as follows: The ones or unit digit of the division factor $N_E=10-n_E$, where $n_E$ is the particular digit set in the 1's column. The tens digit of the division factor $$N_Z=9-n_Z$$

where $n_Z$ is the particular digit set in the 10's column. The hundreds digit of the division factor $N_H=9-n_H$, where $n_H$ is the particular digit which is set in the 100's column.

If the division factor has a zero at the end for example, a zero must be set at the ones position. The carry "1" must be set as an additional digit in the 10's column. For example, with a division factor of 310 a 9 must be set in the 10's column rather than an 8. This complicated setting causes difficulties.

To overcome these difficulties it is known to use an arrangement in which the final position of the frequency divider will be $10^m-1$, where *m* represents the number of decades. In an arrangement of three counting stages the final position would be 999. The difficulties mentioned above being connected with the prior art no longer occur with this type of arrangement and faultless calibration of the setting knobs for a transmitting arrangement for example is possible for the division factor.

Such an arrangement is shown in FIGURE 1. A divider which includes three counting stages 1, 2, and 3 is illustrated, the counting stages being connected in series. The starting position of the three counting stages in determined by the condition of the three setting devices 4, 5, and 6 which are set to a desired level. When the counter has reached the position 900 the AND-circuit 7 has two of its input lines actuated by the two output lines of the counter 3. When the counter attains the position 990, the same occurs from counter 2. After eight further pulses, that is, at counter position 998, the AND-gate 7 is placed into such a condition of readiness that the next pulse, that is the 999th, only has to change the first flip-flop into its other condition. The AND-gate 7 then emits an output pulse if all of the inputs have a potential thereon.

This is the situation when the counter attains the position 999. The output pulse of the AND-gate 7 is connected with an amplifier 8 which is utilized to place the counting stages 1 to 3 back to their starting position which is set at devices 4, 5 and 6. At the same time, the frequency of the output pulses of the AND-gate 7 equals $f_E/N$, which is the desired frequency which has been divided out of the input frequency so that the output pulses of the AND-gate 7 can be further utilized. By means of this divider arrangement, it is possible to divide input frequencies up to a maximum of 8 megacycles, if flip-flops are used which can follow a frequency of 20 megacycles.

With this in mind, it is a main object of the present invention to provide a frequency divider which also avoids the above mentioned difficulties.

It is another object of the invention to increase the maximum possible frequency which can be used in a frequency divider.

A further object of the invention is to provide an arrangement in which there is a lower power requirement than previously needed for similar elements used in this art.

Still a further object is to provide an arrangement of the character described which can be constructed with less structural components and thus at less expense.

The frequency divider of the invention is also constructed of series-connected frequency stages with one being assigned to each of the individual decades of the division factor. The counting stages always count from a number $n$ which can be externally set. The counting continues to a final position which is the same for all division factors. After this the counting stages are reset to the position corresponding to the number $n$. However, in order to have the maximum possible divider frequency, the divider according to the present invention is constructed to have a final position of the counting stages which is $10^m-2$, or when the last counting stage is fully utilized this would be $1.6 \cdot 10^m-2$, where $m$ represents the number of decades. In other words, the final position of the counting stages in this invention is equal to $K-2$, where K is the largest number that can be registered in the counter. In one case the largest number K may equal $10^m$, and in the other case it may equal $16^m$. Switching means are provided so that at this position of the counting stage the input of the counting stages is blocked when the next subsequent input pulse is received. However, this next input pulse resets the counting stages to the starting position $n$ via a gate actuated by the switching means. At the same time these separated pulses can be further used because their frequency is equal to the initial frequency divided by the division factor.

Using the above-described frequency divider of the present invention input frequencies up to 20 megacycles can be divided if the flip-flops which are used can follow the frequencies of this magnitude. However, such rapid flip-flops need only be used in the first counting stages while for counting stages of higher decades slower acting flip-flops can be used. Thus, it is possible for example to use flip-flops in the counting stage for the second decade having a limit frequency of 11 megacycles while the flip-flops of the third decade need be capable of counting to 4 megacycles.

With the divider of the present invention, when three counting stages are utilized when division factors between 2 and 999, or 2 and 1599 can be set. The setting of the 1's, 10's and 100's digits takes place independently of one another. The maximum input frequency is equal to the maximum counting frequency of the flip-flops in the first counting stage. However, in the counting stages of subsequent decades slower and less expensive flip-flops with lower power requirements can be utilized.

Additional objects and advantages of the present invention will become apparent upon consideration of the following description when taken in conjunction with the accompanying drawings in which.

Figure 1:
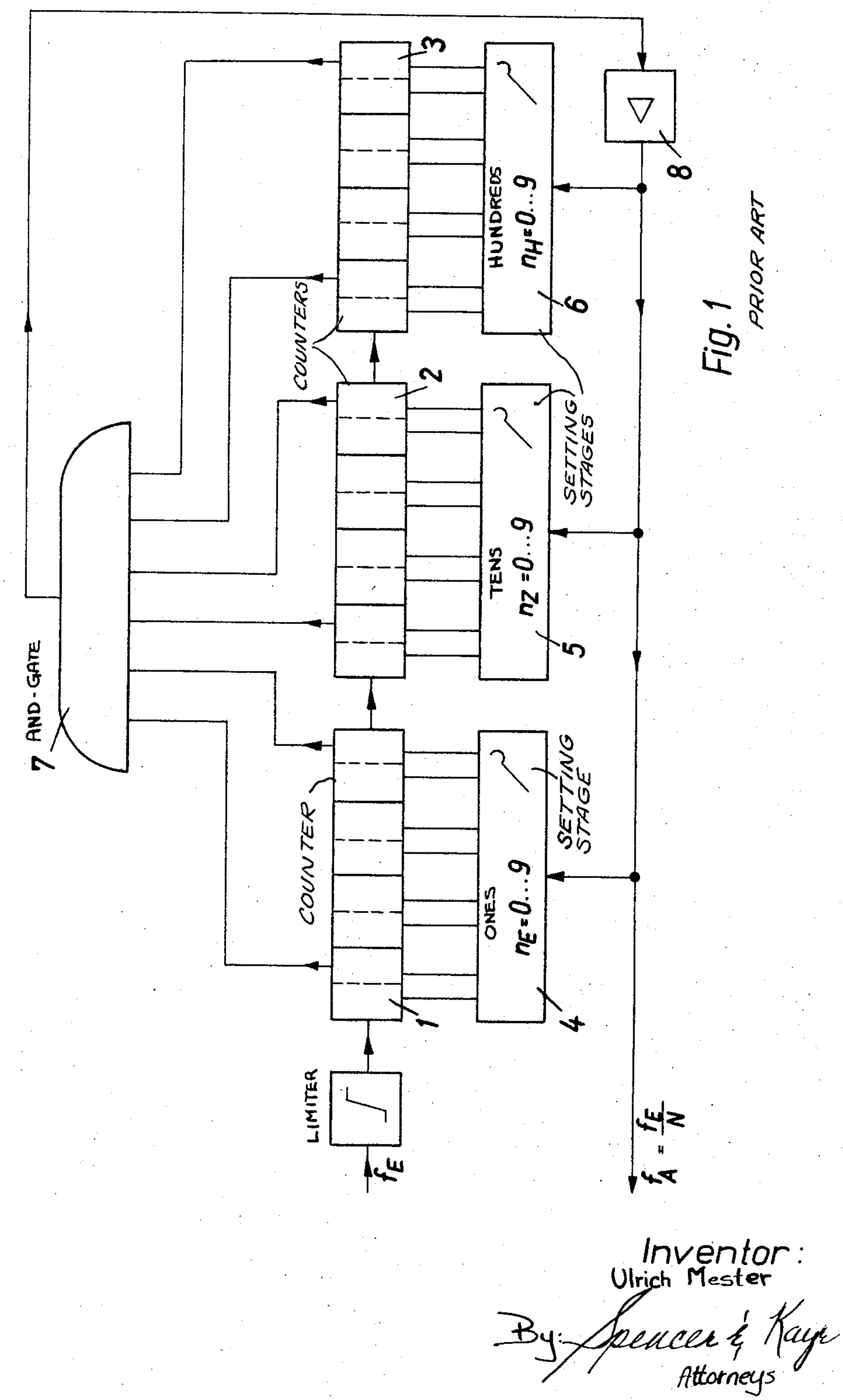
Fig. 1 PRIOR ART
FIGURE 1 is a block diagram illustrating one embodiment of a known frequency divider, which has been discussed above.
Figure 2:
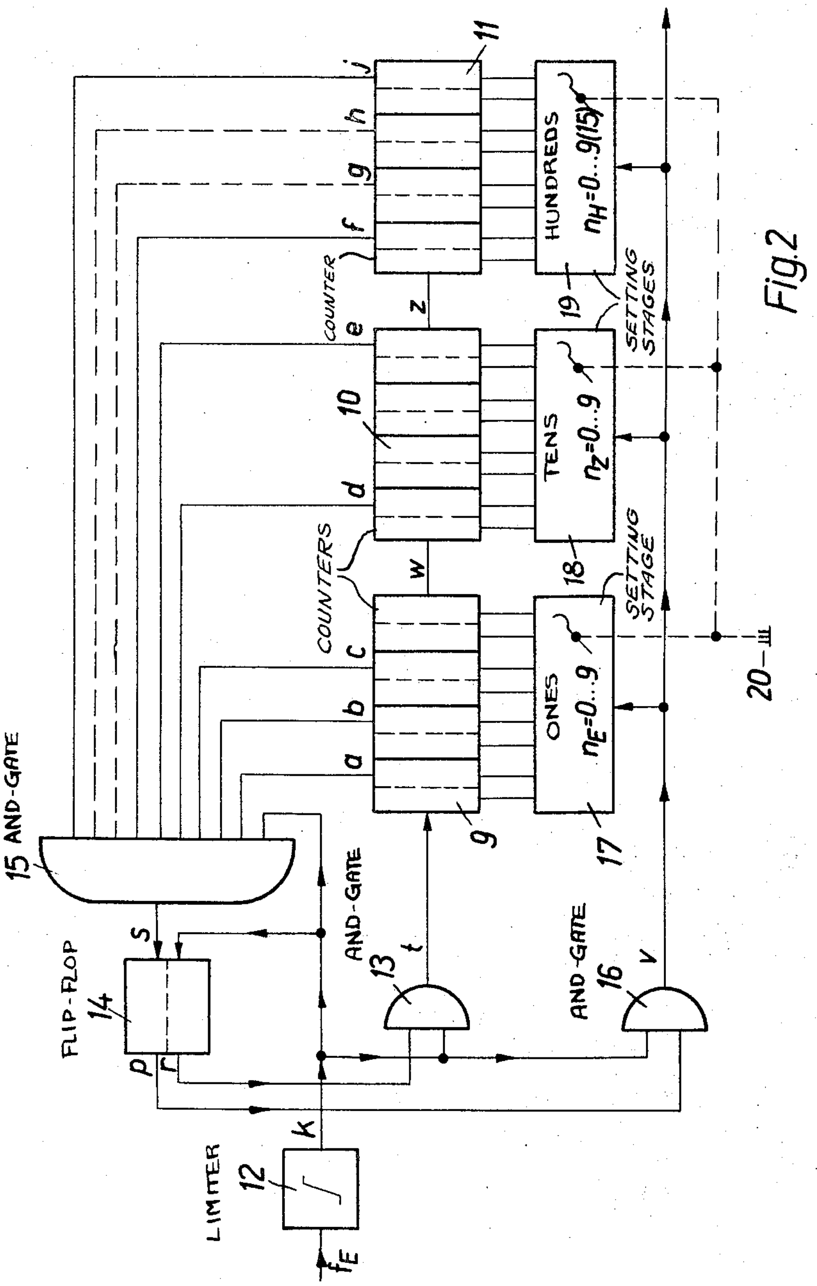
FIGURE 2 is a block diagram of a counter constructed in accordance with the present invention.

With more particular reference to FIGURE 2, three counting stages 9, 10 and 11 are provided, each of which is constructed of four flip-flops. The pulses at the input frequency $f_E$ are shaped symmetrically and rectangularly by means of the limiter 12. Each pulse at this frequency, with its negative flank, switches the counting stages via line $k$, the AND-gate 13, and the line $t$, into the next respective counting position. The AND-gate 13 is so controlled by flip-flop 14 via the line $r$ that it transfers jumps in voltage.

For this purpose, the line $r$ should be at positive potential. If it is assumed that only the lines $a$, $b$, $c$, $d$, $e$, $f$, and $j$ are provided between the counter and the AND-gate 15, then the lines $f$ and $j$ of counting stage 11 become positive when the counter has reached the position 900. After 90 further pulses, the lines $d$ and $e$ which are the output lines of counter 10 are also at a positive potential. After the 997th pulse, the output lines of counter 9, that is, $a$, $b$ and $c$, also have a positive potential. However, the output $s$ of the AND-gate 15 remains negative.

Upon the occurrence of the next subsequent input pulse, the line $k$ changes from negative to positive potential. When this occurs, there is also obtained a positive potential at the output $s$ of the AND-gate 15. The rear flank of the 998th pulse switches the counter stage 9 into the corresponding position. Because of the negative voltage jump on line $k$, there is also a negative voltage jump at the output of the AND-gate 15, that is, at output $s$, and this latter voltage jump sets the flip-flop 14 into its other position. Because of this, the output line $p$ becomes positive while $r$ becomes negative. When this occurs, no negative voltage jump is transmitted from the AND-gate 13.

The 999th pulse or its rear flank thus can not switch the counter any further. However, because of the positive potential on line $p$, the line $v$ is provided with a positive potential when the 999th pulse occurs and this is accomplished via the AND-gate 16. At the end of the 999th pulse, the negative flank on line $v$ brings the counting stages 9, 10 and 11 to their starting positions via the devices 17, 18 and 19. This starting position is determined by the number which can, for example be manually set by the setting device 20. Also, the 999th pulse changes the flip-flop 14 back to its starting position with a positive output at $r$. Thus, the AND-gate 13 is again opened for the transmission of negative voltage jumps while the AND-gate 16 is again closed. The next following pulse, which is the 1000th pulse, changes the counter to the position $n+1$ and the counting process begins again.

The lines $g$ and $h$ shown in dashed lines as connected from the last counting stage 11 to the AND-gate 15 are only needed if the divider is to be enlarged to have a division factor of 1599.

Figure 3:
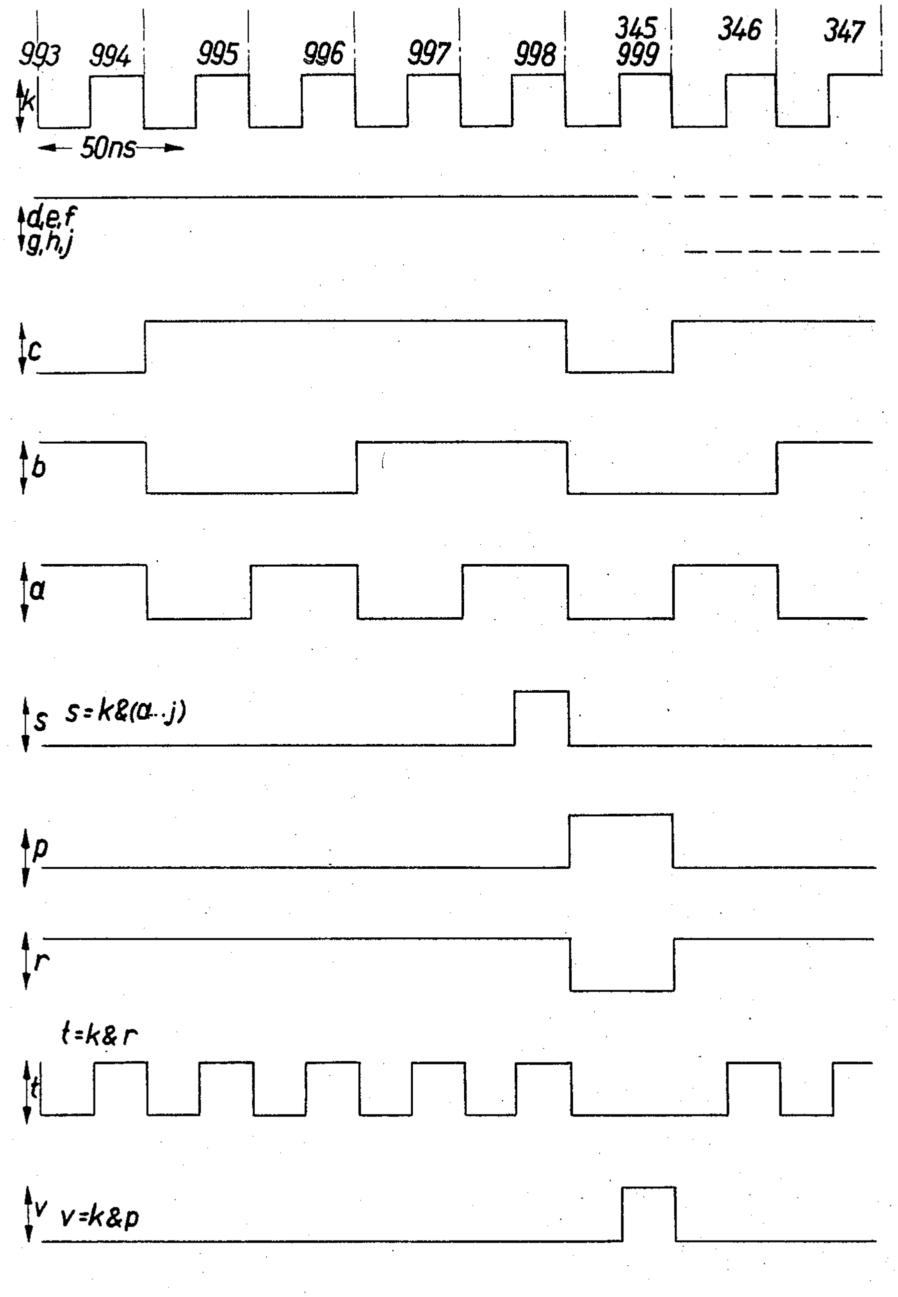
FIGURE 3 shows time plots indicating the voltages appearing at various points throughout the circuit of FIGURE 2.

FIGURE 3 illustrates the voltage conditions on the individual lines $a$ through $k$ and $p$, $r$, $s$, $t$ and $v$ beginning with the 993rd pulse. In the figure, the division factor is assumed to be $N=999-345=654$. Accordingly, the 345th input pulse will move the counter to its 999th position.

As is borne out in the figures mentioned above for the maximum for the divider frequency for the individual counting stages, it is not possible in the above-described frequency divider to use flip-flops for the counting stages of higher decades which may be ten times slower than the flip-flops of a respective preceding stage. In order to make this possible, that is, to be able to use flip-flops of a maximum counting frequency of 2 megacycles in the second counting stage, and 0.2 megacycle in the following counting stage, etc., in accordance with a further feature of the invention an intermediate storage process is performed for the final position of the counting stages of the higher decades.

Figure 4:
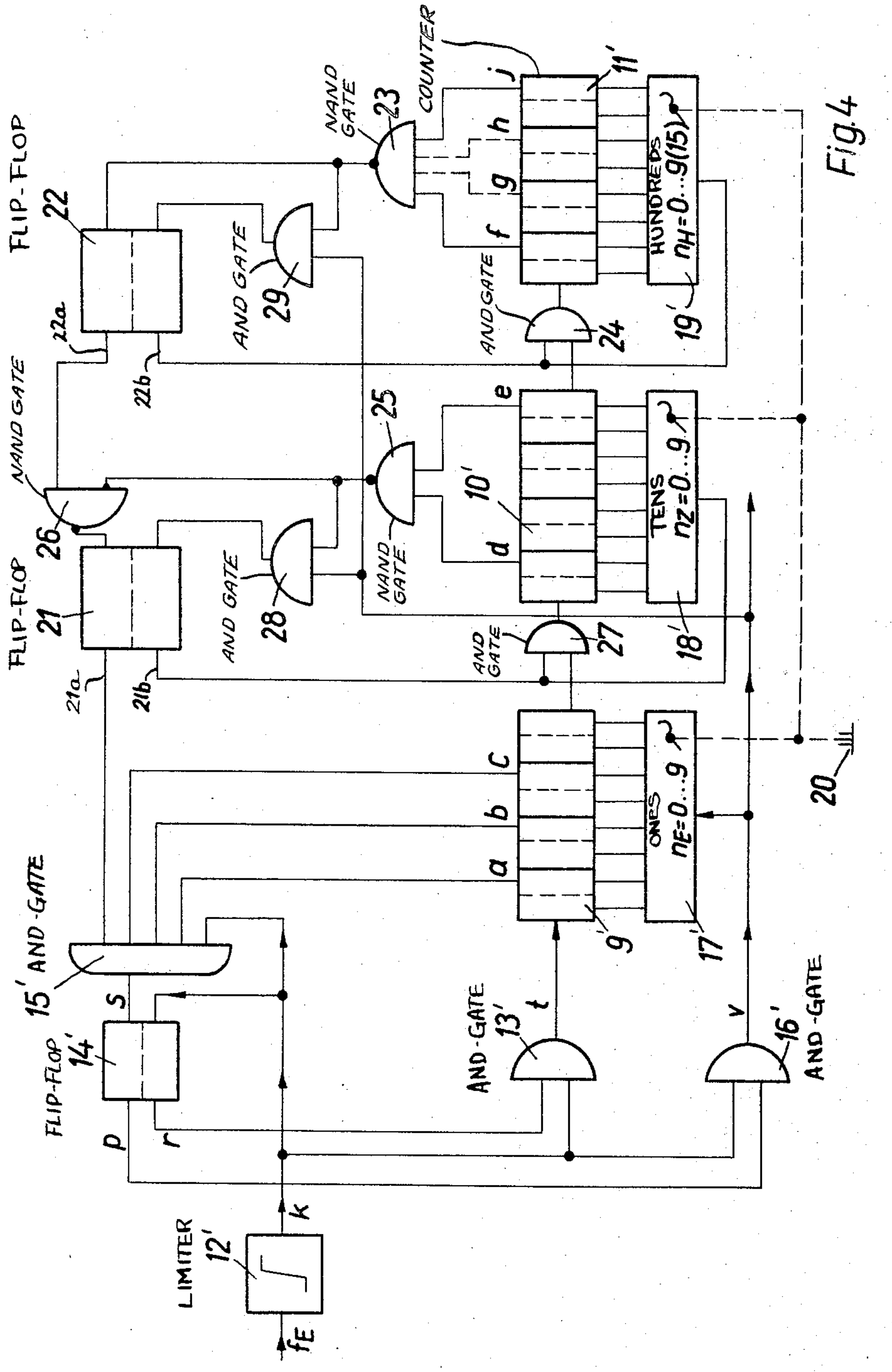
FIGURE 4 is a block diagram of a modified form of a divider constructed in accordance with the present invention.

This feature of the invention is accomplished as shown in more detail in FIGURE 4. Those portions of FIGURE 4 which are identical to those of FIGURE 2 are provided with similar reference numerals but with a prime added.

Thus, the arrangement of FIGURE 4 is provided with a limiter 12', a first AND-gate 13', three counting stages 9', 10', and 11', and setting stages 17', 18', and 19'. Also, a coincidence or AND-gate 15' is connected as is a bistable flip-flop stage 14' and a further AND-gate 16'. Also, there are intermediate storage members connected in the connecting lines $d$ and $e$ as well as in $f$ and $j$ of the counting stages 10' and 11', respectively. These storage units 21 and 22, respectively, are constructed in the form of flip-flops. In these intermediate storage units the numbers 990 (for intermediate storage 21) and 900 (for intermediate storage 22) are stored. When the position 900 is reached in the counter the negated AND-gate or NAND-gate 23 responds and changes the condition of the flip-flop 22 in such manner that its upper output becomes positive. At the same time the negative voltage jump at its lower output is used to set the last decade, that is, the counting stage 11' to the position corresponding to the hundreds column or digit of the division factor and to block the input of the third counting stage 11' from receiving the output of the second counting stage 10' by means of an AND-gate 24.

When the counter reaches the position 990 the storage and the setting of the tens digit occurs in an analogous manner to the process described above. The NAND-circuit 25 produces an output signal which after being negated (indicated by the dot at the input of gate 26) together with the output signal of storage unit 22, provides inputs to NAND-circuit 26 which then also has a negative going output signal. By means of the output signal from NAND-circuit 26 the intermediate storage unit 21 is flipped to its other condition. The output of this intermediate storage unit prepares the AND-gate 15'. At the same time resetting of the counting stage 10' to its starting position is provided by means of the second output of the intermediate storage unit 21 and also blocking of the input to the counting stage 10' from the output of the counting stage 9' is provided by means of AND-gate 27.

It is now only necessary to provide for resetting of the counting stage 9' which is associated with the ones digit of the division factor via the gate 16'. The pulse which effects the resetting step also resets the storage units 21 and 22 back to their initial positions. In order to prevent these storage units from being placed in their initial positions at the time the hundreds or tens digit of the division factor N is equal to 0, (that means when the set-number $N_Z$ or $N_H$ is 9) additional AND-gates 28 and 29 are provided. When $N_Z$ or $N_H$ is 0 the output of NAND-gates 25 or 23 are negative. Now the negative jump on line $v$ is not transferred to storage-units 21 or 22 and thus the storage units 21 or 22 remain in their condition.

The storage flip-flop 22 must be as fast as the flip-flop of the second decade and the storage flip-flop 21 must be as fast as the flip-flops of the first decade. The additional expenditure in circuit components is well offset by the results obtained, particularly if there is a need for a lower power requirement, because slow flip-flops require less power, can be constructed with less structural components, and thus are less expensive.

It will be understood that the above description of the present invention is susceptible to various modifications, changes, and adaptations, and the same are intended to be comprehended within the meaning and range of equivalents of the appended claims.

What is claimed is:

1. In a frequency divider having an adjustable division factor including a counter comprising a plurality of series-connected frequency counting stages one assigned to each decade of the division factor and arranged so that the counting stages always count from a number $n$ which can be externally set up to a final position which is the same for all division factors whereupon the counting stages are again set to the position corresponding to the number $n$ and an output signal appears at the output of the divider, the improvement wherein the counter is arranged to have a final position of $K-2$, where K is the largest number that can be registered in said counter means, and switching means are provided for blocking the input of the counting stages for the subsequent input pulse when the counter reaches its final position, and a gate is provided which is actuated by said switching means for resetting the counting stages to their starting position $n$ when such subsequent input pulse occurs.

2. A frequency divider, having an adjustable division factor, comprising, in combination:

counter means including a plurality of series-connected frequency counting stages one assigned to each decade of the division factor and arranged so that the counting stages always count from a number $n$, which can be externally set, up to a final position of $K-2$, where K is the largest number that can be registered in said counter means, at which point the counting stages are again set to the position $n$ and an output signal is issued;

means for providing said counter means with pulses at a frequency which is to be divided;

switching means for blocking the input of the counting stages for the subsequent input pulse when the counter reaches its final position; and gate means connected to be actuated by said switching means for resetting the counting stages to their starting position $n$ when such subsequent input pulse occurs.

3. A frequency divider having an adjustable division factor, comprising, in combination:

counter means including a plurality of series-connected frequency counting stages, one assigned to each decade of the division factor and arranged so that the counting stages may count from an externally set number $n$ up to a final position of $K-2$, where K is the largest number that can be registered in said counter means, when an output signal is issued;

setting means connected to said counter means for selectively setting the counter means to a starting position $n$ when actuated;

input means for providing said counter means with pulses at a frequency which is to be divided;

switching means for blocking the input of the counting stages for the subsequent input pulse when the counter reaches its final position; and gate means connected to said switching means and in response thereto actuating said setting means.

4. A frequency divider as defined in claim 3 wherein said switching means includes an AND-gate having inputs which are the outputs of the counting stages which have positive output voltages at the position of the counting stages representing the number $K-3$ and a further input connected to said input means so that the AND-gate delivers an output signal when the $K-2$ pulse occurs.

5. A frequency divider as defined in claim 4 wherein said switching means includes a bistable multivibrator controlled by the rear flank of the $K-2$ pulse, a first gate connected to one output of said multivibrator so that said first gate prevents the input means from delivering the $K-1$ pulse to the counter means, said gate means including a second gate connected to the other output of said multivibrator so that said second gate delivers this $K-1$ pulse to actuate said setting means.

6. A frequency divider as defined in claim 5 wherein there are intermediate storage means provided between the outputs of the counting stages for the higher decades which outputs represent the number $K-10$ by positive voltage and the AND-gate for storing this number and providing immediate resetting of the counting stages by actuating the appropriate portion of the setting means.

7. A frequency divider as defined in claim 6 wherein said intermediate storage means includes a flip-flop, and means for returning the flip-flop to its original condition when the divider issues an output signal.

References Cited

UNITED STATES PATENTS

| | | | |
|---|---|---|---|
| 2,970,226 | 1/1961 | Skelton et al. | 307—88.5 |
| 3,147,442 | 9/1964 | Fritzsche et al. | 328—41 |
| 3,217,267 | 11/1965 | Loposer | 328—39 XR |
| 3,287,648 | 11/1966 | Poole | 328—48 |

ARTHUR GAUSS, *Primary Examiner.*

S. D. MILLER, *Assistant Examiner.*